United States Patent
Ardehali

(10) Patent No.: US 7,639,093 B2
(45) Date of Patent: Dec. 29, 2009

(54) VOLTAGE-CONTROLLED OSCILLATOR HAVING INDEPENDENT OUTPUT FREQUENCY AND AMPLITUDE

(75) Inventor: Mohammad Ardehali, Camarillo, CA (US)

(73) Assignee: Tialinx, Inc., Newport Beach, CA (US)

( * ) Notice: Subject to any disclaimer, the term of this patent is extended or adjusted under 35 U.S.C. 154(b) by 48 days.

(21) Appl. No.: 11/618,812

(22) Filed: Dec. 30, 2006

(65) Prior Publication Data
US 2008/0157878 A1 Jul. 3, 2008

(51) Int. Cl.
*H03K 3/023* (2006.01)
(52) U.S. Cl. .................... 331/57; 331/15; 331/182; 331/185
(58) Field of Classification Search ............... 331/15, 331/57, 109, 182, 183, 185, 186
See application file for complete search history.

(56) References Cited

U.S. PATENT DOCUMENTS

| | | | | |
|---|---|---|---|---|
| 5,563,553 A | * | 10/1996 | Jackson | 331/57 |
| 5,748,048 A | * | 5/1998 | Moyal | 331/34 |
| 6,414,556 B1 | * | 7/2002 | Mizuno | 331/57 |

* cited by examiner

*Primary Examiner*—Robert Pascal
*Assistant Examiner*—Levi Gannon
(74) *Attorney, Agent, or Firm*—Haynes and Boone, LLP

(57) ABSTRACT

In one embodiment, a voltage-controlled oscillator is provided having an output signal whose frequency is responsive to a tuning signal and is independent of amplitude of oscillation. The voltage-controlled oscillator includes: a plurality of differential inverter stages coupled to form a loop, each differential inverter stage having a differential pair of transistors configured to steer a tail current from a current source, the current source sourcing the tail current responsive to a feedback signal; and a control circuit configured to generate the feedback signal responsive to a reference signal such that an amplitude of the output signal is independent of the tuning signal and depends on the reference signal, and the frequency of oscillation is decoupled from the amplitude of oscillation.

7 Claims, 6 Drawing Sheets

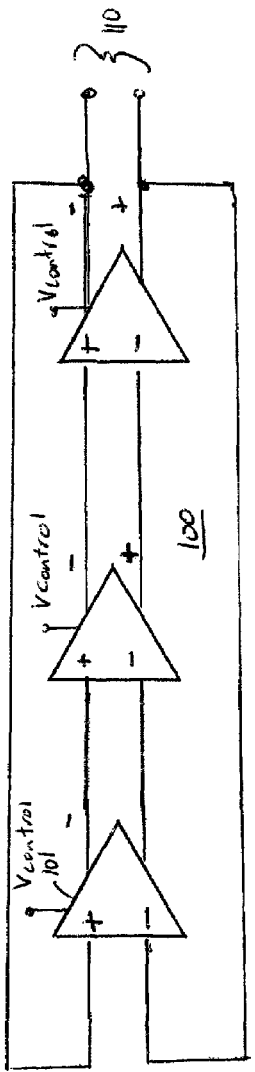
Figure 1 — Prior Art —
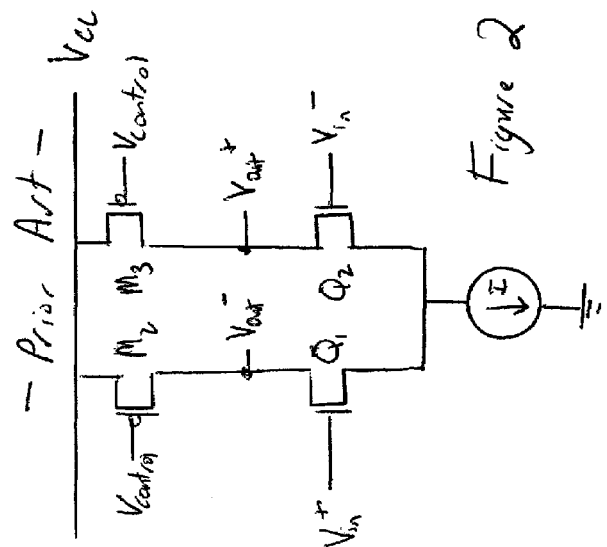
Figure 2 — Prior Art —

US 7,639,093 B2

VOLTAGE-CONTROLLED OSCILLATOR HAVING INDEPENDENT OUTPUT FREQUENCY AND AMPLITUDE

STATEMENT REGARDING FEDERALLY SPONSORED RESEARCH OR DEVELOPMENT

This invention was made with Government support under contract number W31P4Q-06-C-0380 awarded by DARPA. DARPA and the Army have certain rights in the invention.

TECHNICAL FIELD

The present invention relates generally to voltage-controlled oscillators and more particularly to voltage-controlled oscillators having a constant amplitude output signal over a tuning range.

BACKGROUND

If an odd numbered of inverters are coupled together in a loop, a ring oscillator results if the loop gain is greater than one. In contrast, if an even number inverters are coupled together in this fashion, a latch results such as a conventional SRAM cell, which is formed from a pair of cross-coupled inverters. To form a voltage-controlled oscillator (VCO), each inverter stage in a ring oscillator is configured so that its propagation delay is responsive to a control voltage. The resulting ring-oscillator-formed VCOs are important circuit building blocks in applications such as phase locked loops. Because of their common mode noise rejection and tuning properties, differential VCOs are particularly popular in such applications.

A conventional VCO 100 is illustrated in FIG. 1 having three differential inverter stages 101. As will be discussed further with regard to FIG. 2, each differential inverter stage is configured to steer a "tail current" I from a current source responsive to its differential input voltages. The propagation delay through each differential inverter stage and hence the output frequency of a differential output signal from output nodes 110 is controlled by a control voltage, $V_{cntl}$.

FIG. 2 illustrates a typical implementation for differential inverter stages 100. A differential pair of NMOS transistors Q1 and Q2 have their drains isolated from a supply voltage node $V_{cc}$ by PMOS transistors M2 and M3, respectively. Each PMOS transistor M2 and M3 has its gate controlled by the control voltage signal $V_{cntl}$ such that transistors M2 and M3 act as resistors in the triode mode of operation. Thus, the magnitude of the control voltage controls the resistance through transistors M2 and M3 and hence the signal delay in each inverter stage. Each transistor M2 and M3 may thus be represented by a variable resistor of resistance R determined by the control voltage. Differential input voltages $V_{in}^+$ and $V_{in}^-$ control the gates of transistors Q1 and Q2, whose sources are tied to a current source driving the tail current I. The drains of transistors Q2 and Q1 tie to the nodes for differential output voltages $V_{out}^+$ and $V_{out}^-$, respectively. Because transistors Q1 and Q2 form a differential pair, virtually the entire tail current I will steer through the transistor whose gate voltage is higher than a threshold voltage multiple as compared to the remaining gate voltage. For example, if $V_{in}^+$ is sufficiently higher than $V_{in}^-$, the tail current steers through Q1. The output voltage $V_{out}^+$ will thus be at $V_{cc}$ whereas $V_{out}^-$ will be at $V_{cc}-I*R$, where R is the resistance of M2 and I is the tail current. These output voltages switch if $V_{in}^-$ is sufficiently higher than $V_{in}^+$. The amplitude of the output signal is thus I*R. It can be shown that the output frequency of voltage-controlled oscillator 100 is proportional to the inverse of the propagation delay τ for each inverter stage 101. In turn, the delay is proportional to resistance R through transistors M2 and M3. Thus, the output frequency is a nonlinearly dependent on the control voltage because the control voltage controls the resistance R. It follows that the output frequency is nonlinearly dependent on the output amplitude.

This nonlinear dependence is undesirable because of the coupling of the frequency of oscillation to the amplitude of oscillation. Accordingly, there is a need in the art for a voltage-controlled oscillator having an output signal whose amplitude of oscillation is constant and independent of frequency of oscillation.

SUMMARY

In one embodiment, a voltage-controlled oscillator is provided having an output signal whose frequency is responsive to a tuning signal. The voltage-controlled oscillator includes: a plurality of differential inverter stages coupled to form a loop, each differential inverter stage having a differential pair of transistors configured to steer a tail current from a current source, the current source sourcing the tail current responsive to a feedback signal; and a control circuit configured to generate the feedback signal responsive to a reference signal such that (i) the amplitude of the output signal is constant, and (ii) the frequency of oscillation of the output signal is independent of the amplitude of oscillation.

In another embodiment, a phase locked loop (PLL) is provided that includes: a phase detector operable to compare the phase between a divided signal and an input signal to provide a phase detector output; a loop filter to filter the phase detector output to provide a tuning signal; a voltage controlled oscillator (VCO) operable to provide an output signal whose frequency depends on the tuning signal, wherein the VCO is configured to respond to a reference signal to control an amplitude of the output signal, and wherein the frequency and amplitude of oscillation are independent of each other.

The invention will be more fully understood upon consideration of the following detailed description, taken together with the accompanying drawings.

BRIEF DESCRIPTION OF THE DRAWINGS

FIG. 3b is a block diagram of a VCO including the control circuit of FIG. 3a.

Embodiments of the present invention and their advantages are best understood by referring to the detailed description

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Figure 3A:
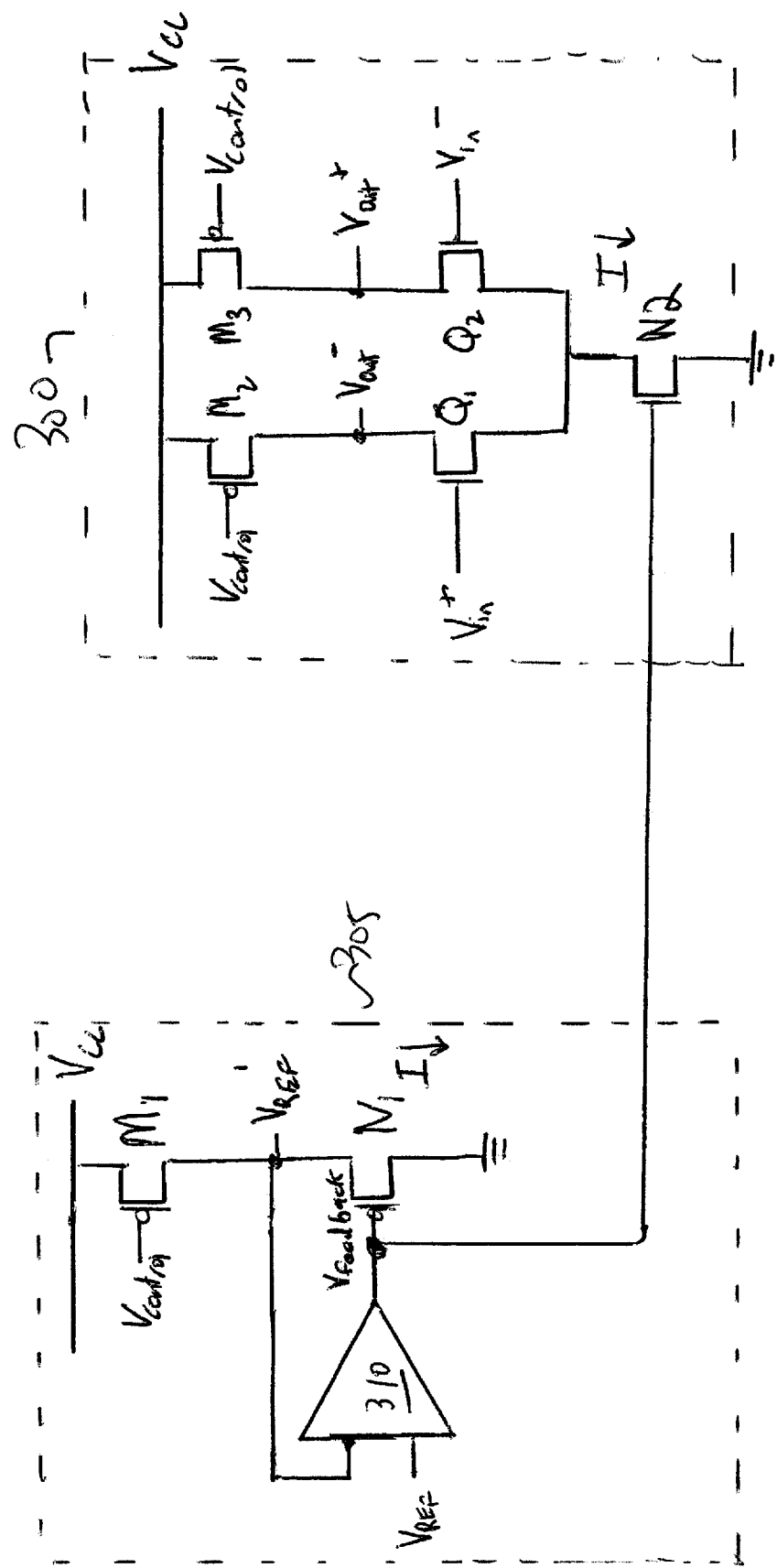
FIG. 3a is a circuit diagram of a control circuit and a corresponding differential inverter stage in accordance with an embodiment of the invention.
Figure 2:
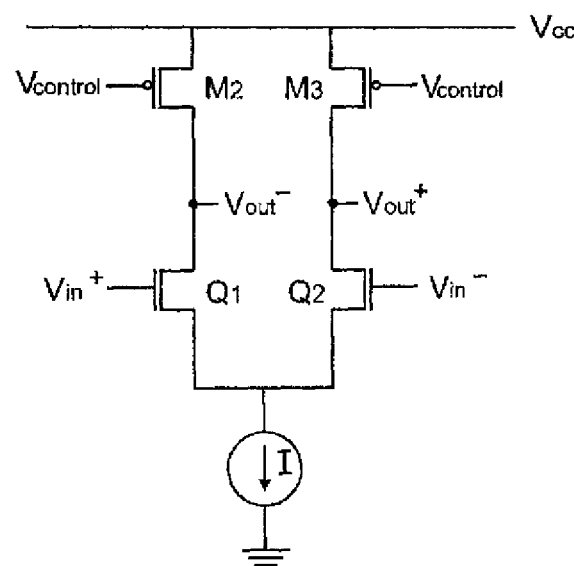
FIG. 2 is a circuit diagram of a differential inverter stage for the voltage-controlled oscillator of FIG. 1.
Figure 3B:
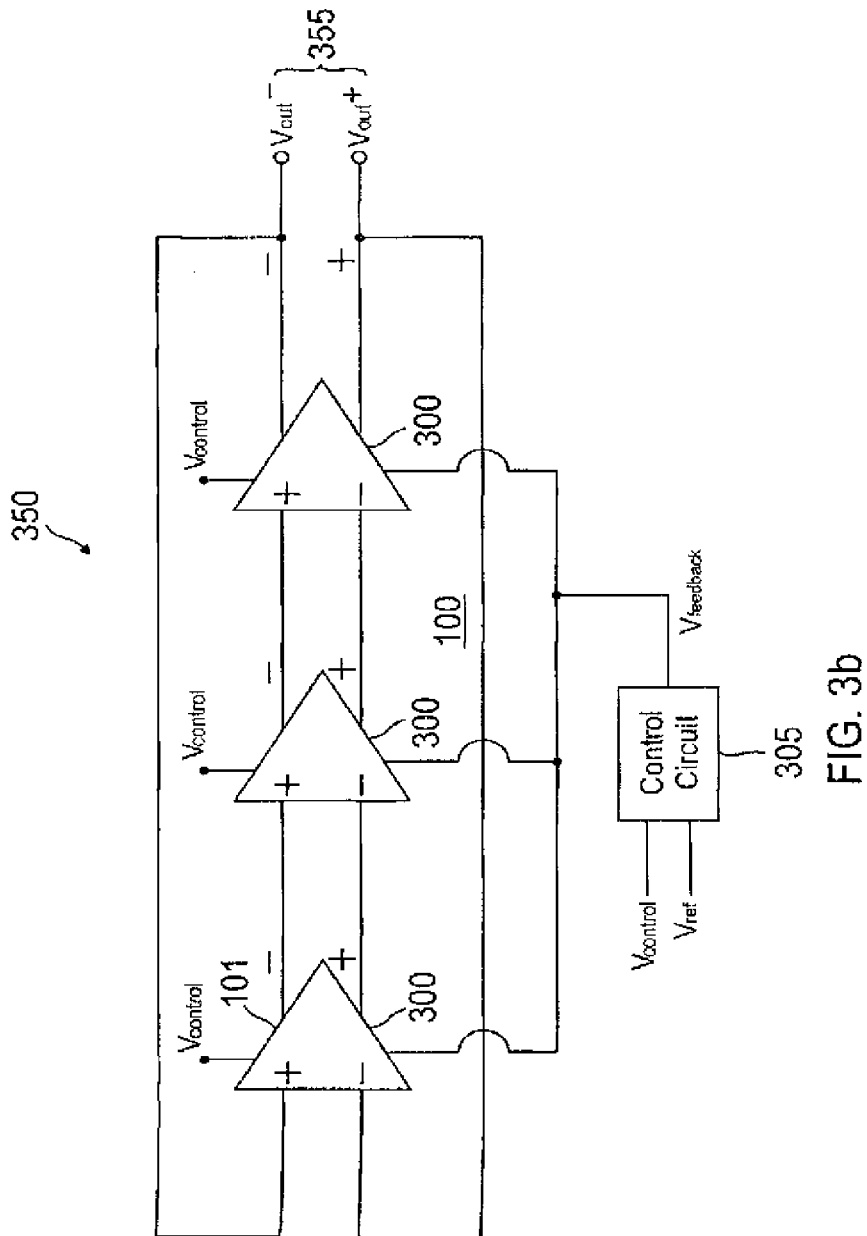
Figure 4:
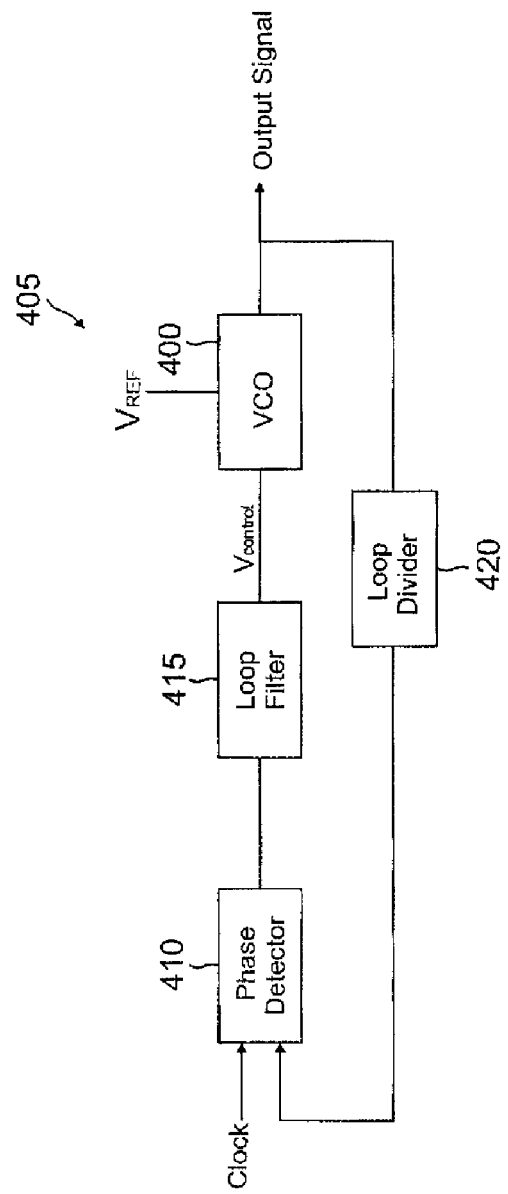
Figure 5:
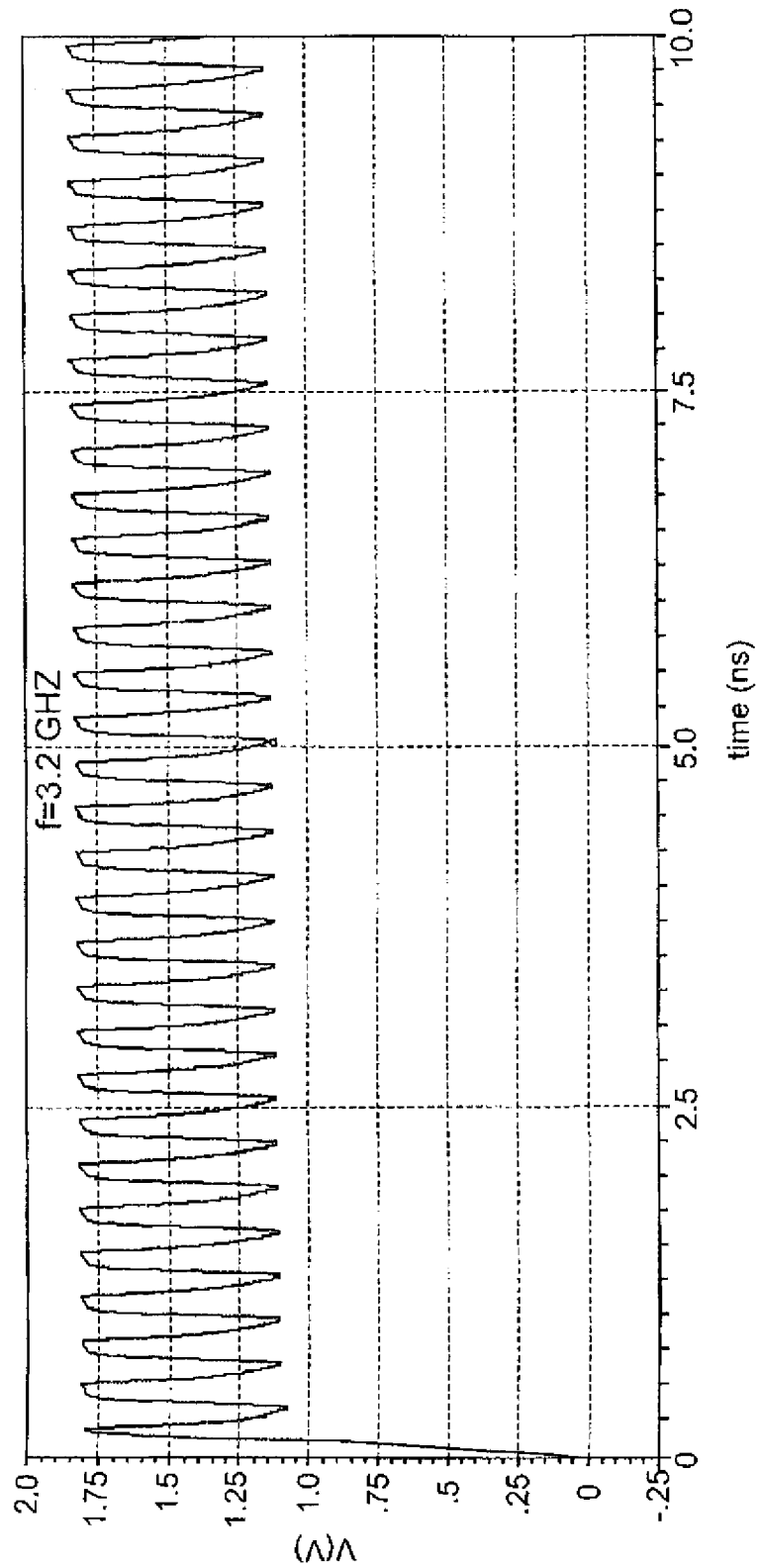
Figure 6:
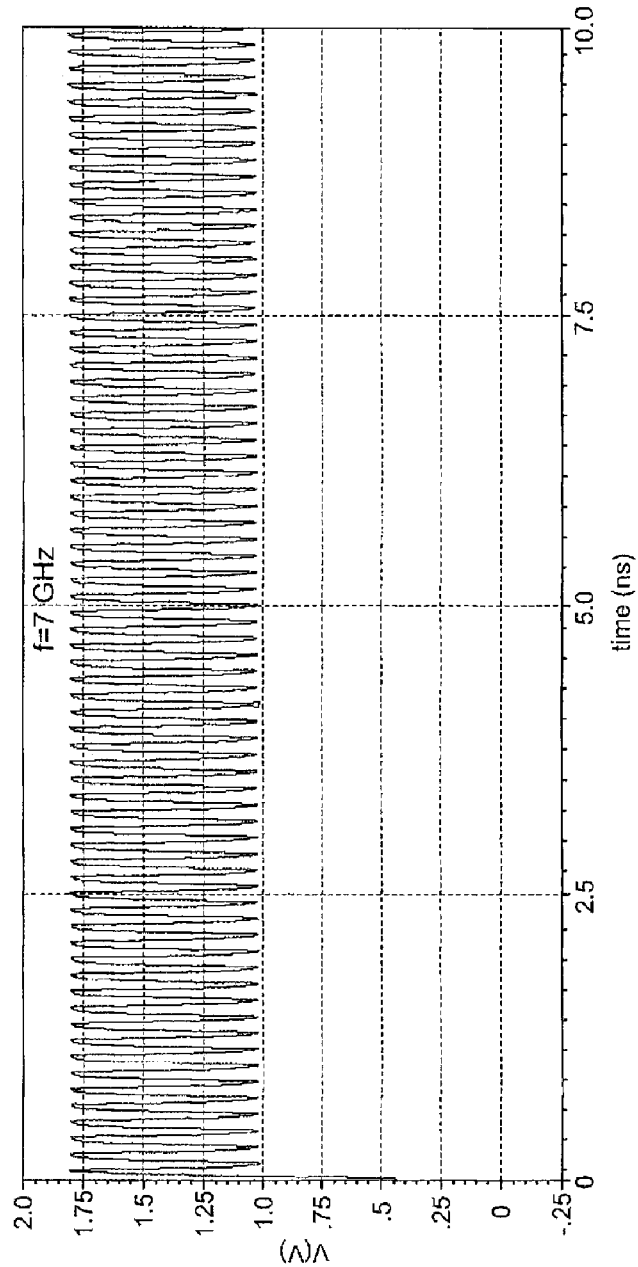
Figure 1:
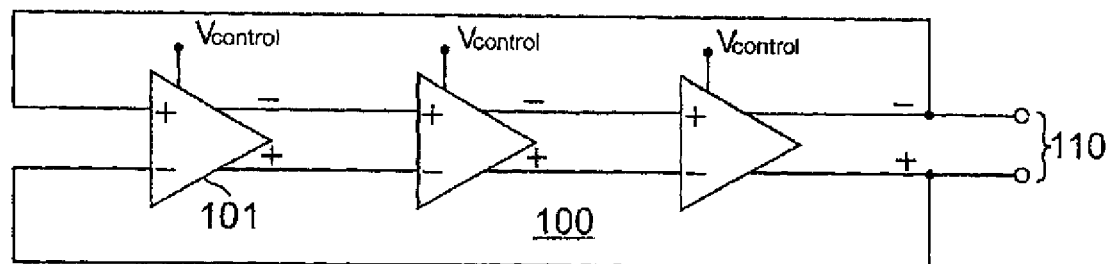
Figure 2:
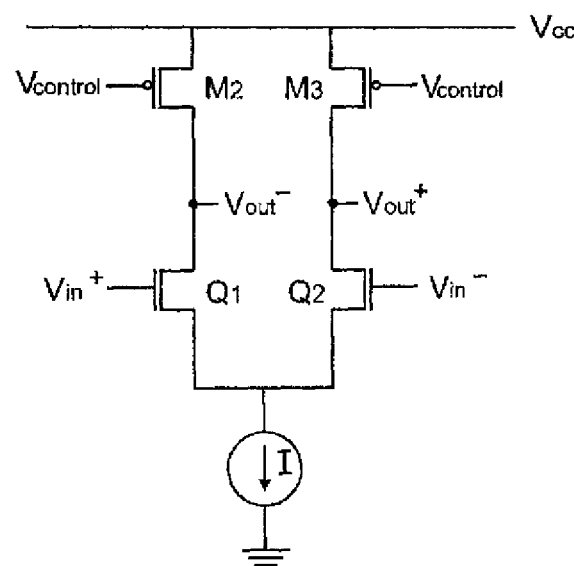
Figure 3A:
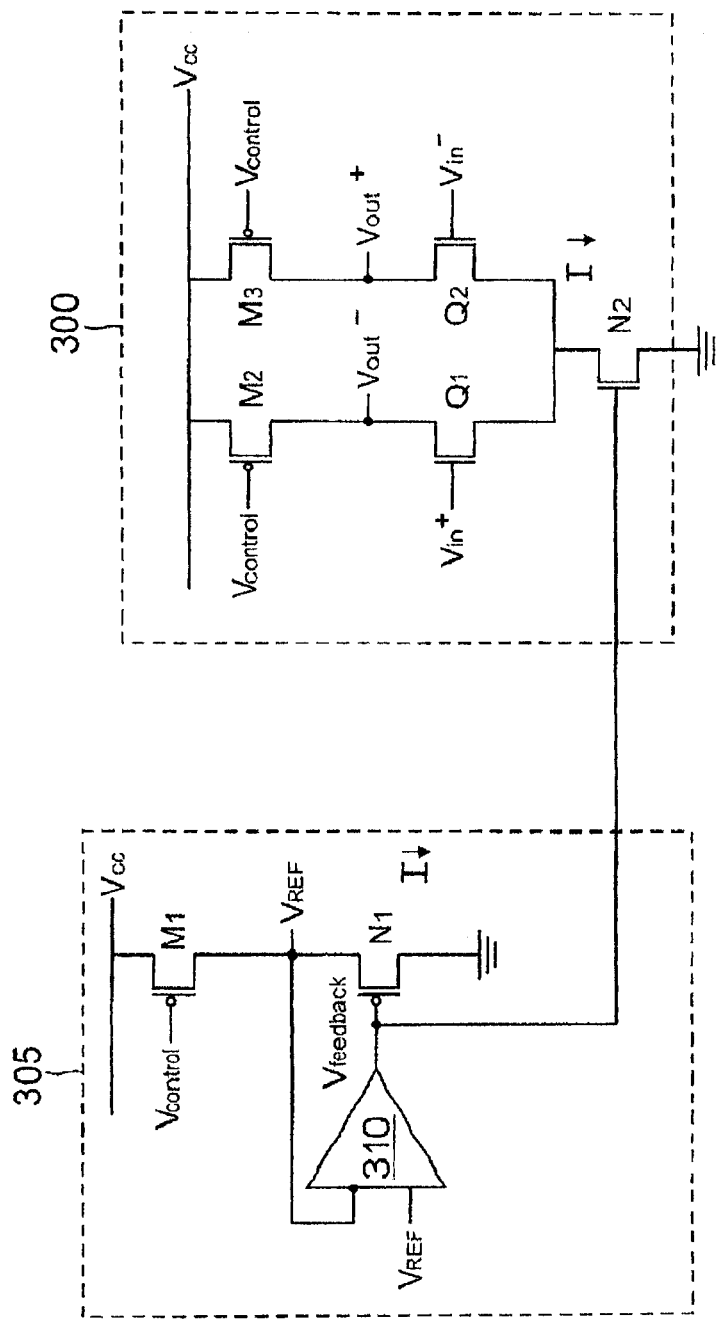
Figure 3B:
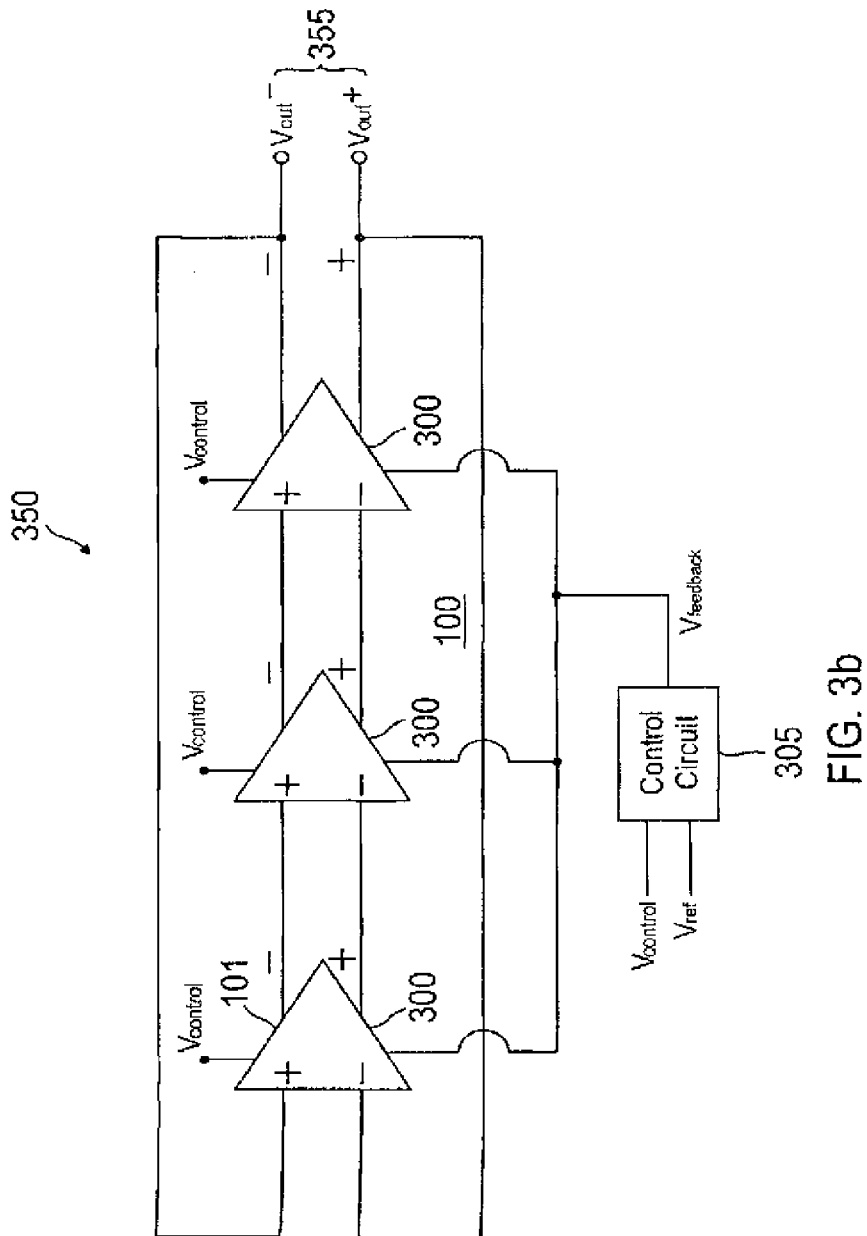
Figure 4:
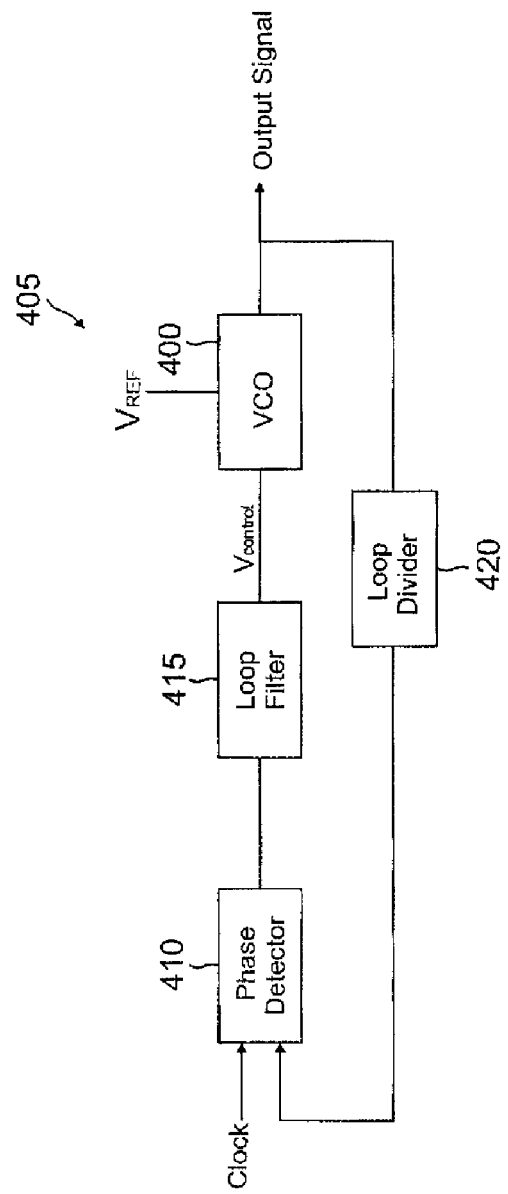
Figure 5:
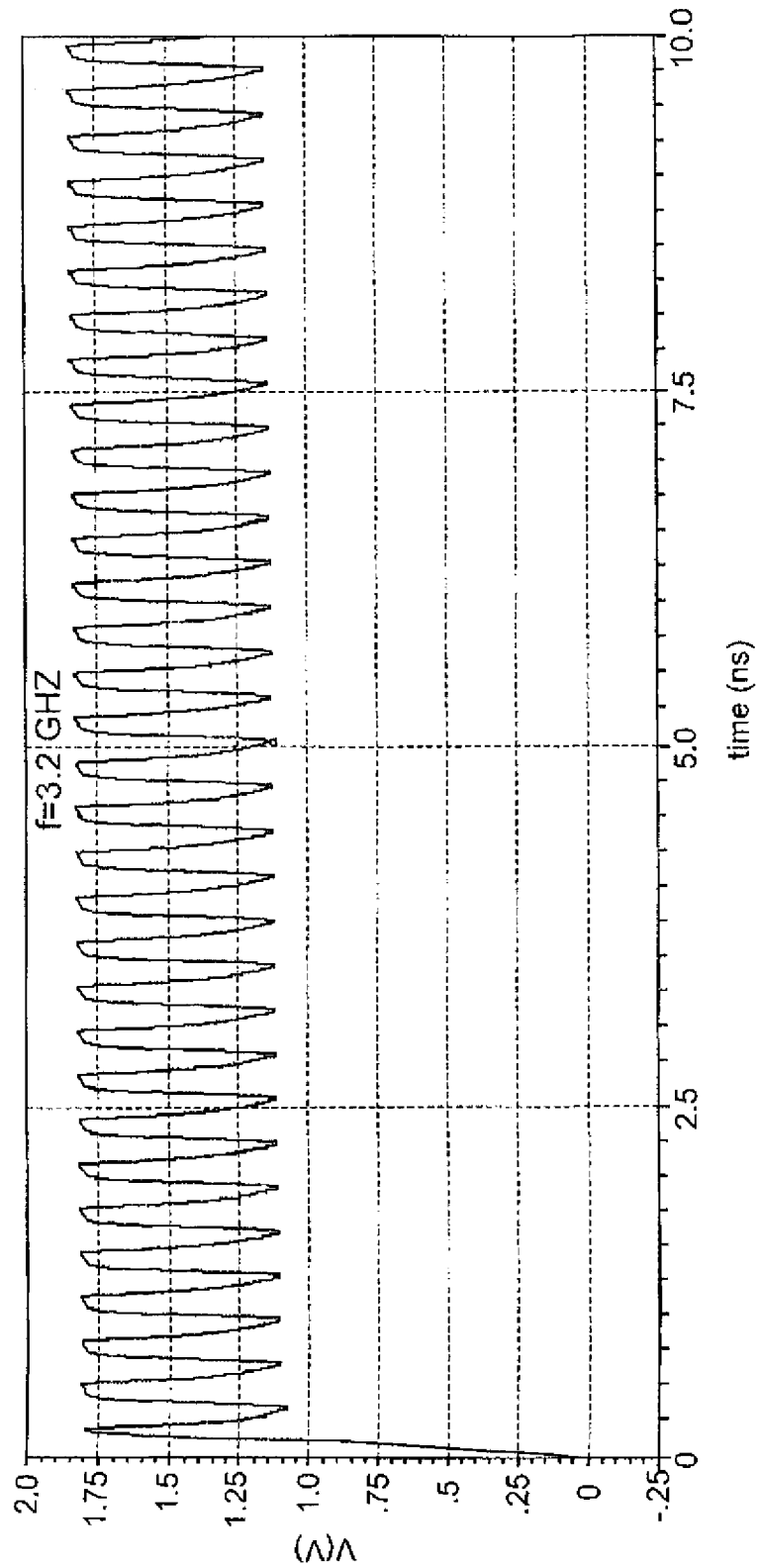
Figure 6:
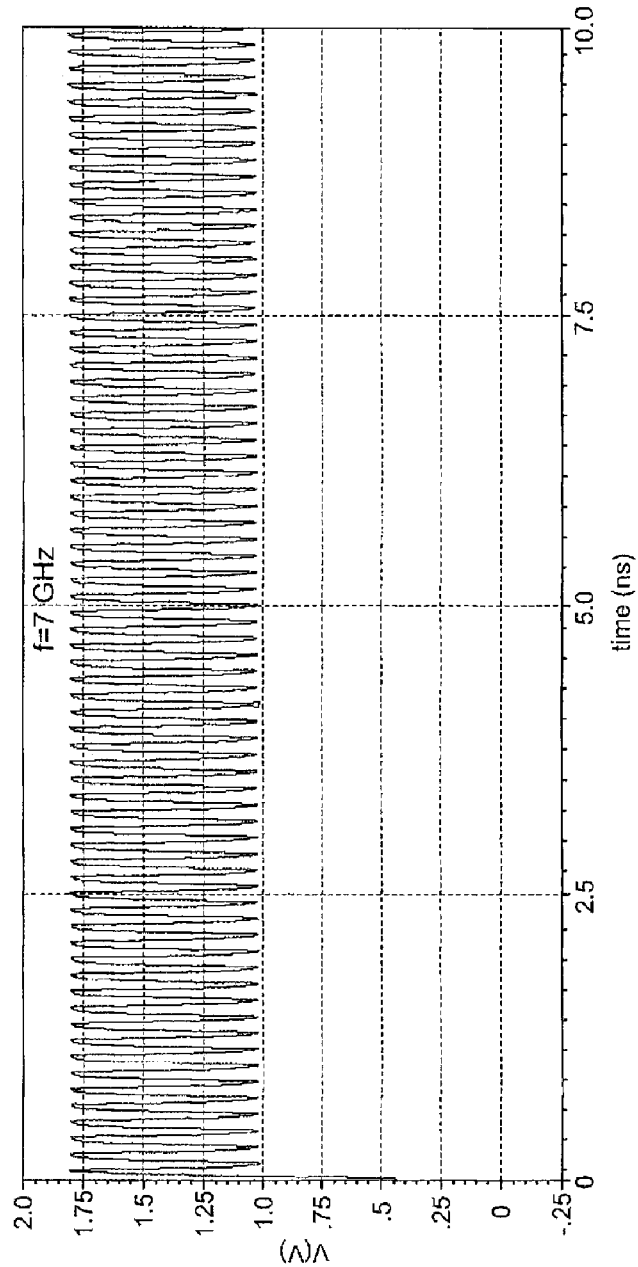

A differential voltage-controlled oscillator is provided whose output signal frequency is independent of its output signal amplitude. Turning now to FIG. 3a, an exemplary differential inverter stage 300 for such an advantageous differential voltage-controlled oscillator is illustrated. A tail current I is steered through a differential pair of NMOS transistors Q1 and Q2 responsive to the difference between differential input voltages $V_{in}^+$ and $V_{in}^-$. The differential input voltage $V_{in}^+$ drives the gate of Q1 whereas $V_{in}^-$ drives the gate of Q2. The drains of NMOS transistors Q1 and Q2 are isolated from a supply voltage node $V_{cc}$ by PMOS transistors M2 and M3, respectively. The drains of Q1 and Q2 form the output nodes for output voltages $V_{out}^-$ and $V_{out}^+$, respectively. A tuning voltage $V_{cntl}$ drives the gates of transistors M2 and M3 such that these transistors operate in the triode mode as discussed with regard to FIG. 2. To prevent an undesirable coupling of the output frequency for a VCO incorporating inverter stage 300 with the output amplitude for such a VCO, a control circuit 305 is configured to control the amplitude of the tail current I responsive to a reference voltage $V_{ref}$ and the tuning voltage $V_{cntl}$. It will be shown below that an output frequency for such a VCO is a linear function of the tuning voltage $V_{cntl}$.

Control circuit 305 includes a PMOS transistor M1 matched to transistors M2 and M3 and an NMOS transistor N1 matched to an NMOS transistor N2. Transistor N2 acts as the current source for the differential pair Q1/Q2 and thus conducts the tail current I that is steered into Q1 or Q2 depending upon the values of the differential input voltages $V_{in}^+$ and $V_{in}^-$. If $V_{in}^+$ is higher by a sufficient multiple of the threshold voltage as compared to $V_{in}^-$, Q1 will conduct virtually all the tail current. Conversely, if $V_{in}^-$ is higher by a sufficient multiple of the threshold voltage as compared to $V_{in}^+$, Q2 will conduct virtually all the tail current. Thus, when either one of the transistors Q1 or Q2 is conducting all the tail current I, the drain of M2 or M3 (respectively) will be at $V_{cc}-I*R$, where R represents the resistance of the M2 or M3 in the triode mode of operation. The drain of M2 and M3 (and hence the differential output voltages $V_{out}^-$ and $V_{out}^+$, respectively) will thus oscillate between $V_{cc}$ when the corresponding transistor is not conducting and $V_{cc}-I*R$ when the corresponding transistor is conducting such that the maximum amplitude of the output signal (taken between the $V_{out}^+$ and $V_{out}^-$ terminals) is $I*R$. As discussed previously, the relationship between R and the output frequency and a corresponding relationship between R and $V_{cntl}$ leads to an undesirable coupling of the output frequency and the maximum signal amplitude for conventional VCO designs.

To sever the relationship between VCO output frequency and amplitude, the control circuit may include a differential amplifier 310 that drives the gate of transistor N1 with a feedback voltage $V_{feedback}$ responsive to the voltage difference between the reference voltage $V_{ref}$ and the drains of transistors N1 and M1. The resulting feedback through the differential amplifier maintains the drains of these transistors at the reference voltage $V_{ref}$ (the drain voltage may thus be represented as $V_{ref}$). The gate of transistor M1 is driven by the tuning voltage $V_{cntl}$. To ensure that this PFET remains in the triode mode of operation, the following condition should be satisfied:

$$V_{cntl}+|V_{th}| \leq V_{ref} \quad (1)$$

where $V_{th}$ is the threshold voltage for M1. In the triode mode of operation, the PFET acts as a resistor and the voltage drop across its source to drain which is equal to the amplitude of oscillation is given by $$IR = V_{cc} - V_{ref} \quad (2)$$

The current I through N1 is also the tail current I through N2 because these transistors are matched and have the same $V_{gs}$, namely $V_{feedback}$. For PFET M1, which operates in triode region, it can be shown that the current I is given by $$I = \mu \frac{W}{L} C_{ox}(V_{cntl} - V_{cc} + |V_{th}|)(V_{ref} - V_{cc}) \quad (3)$$

where W is the channel width, L is the channel length, μ is the magnetic permeability, and $C_{ox}$ is the capacitance of the gate oxide.

Figure 3B:
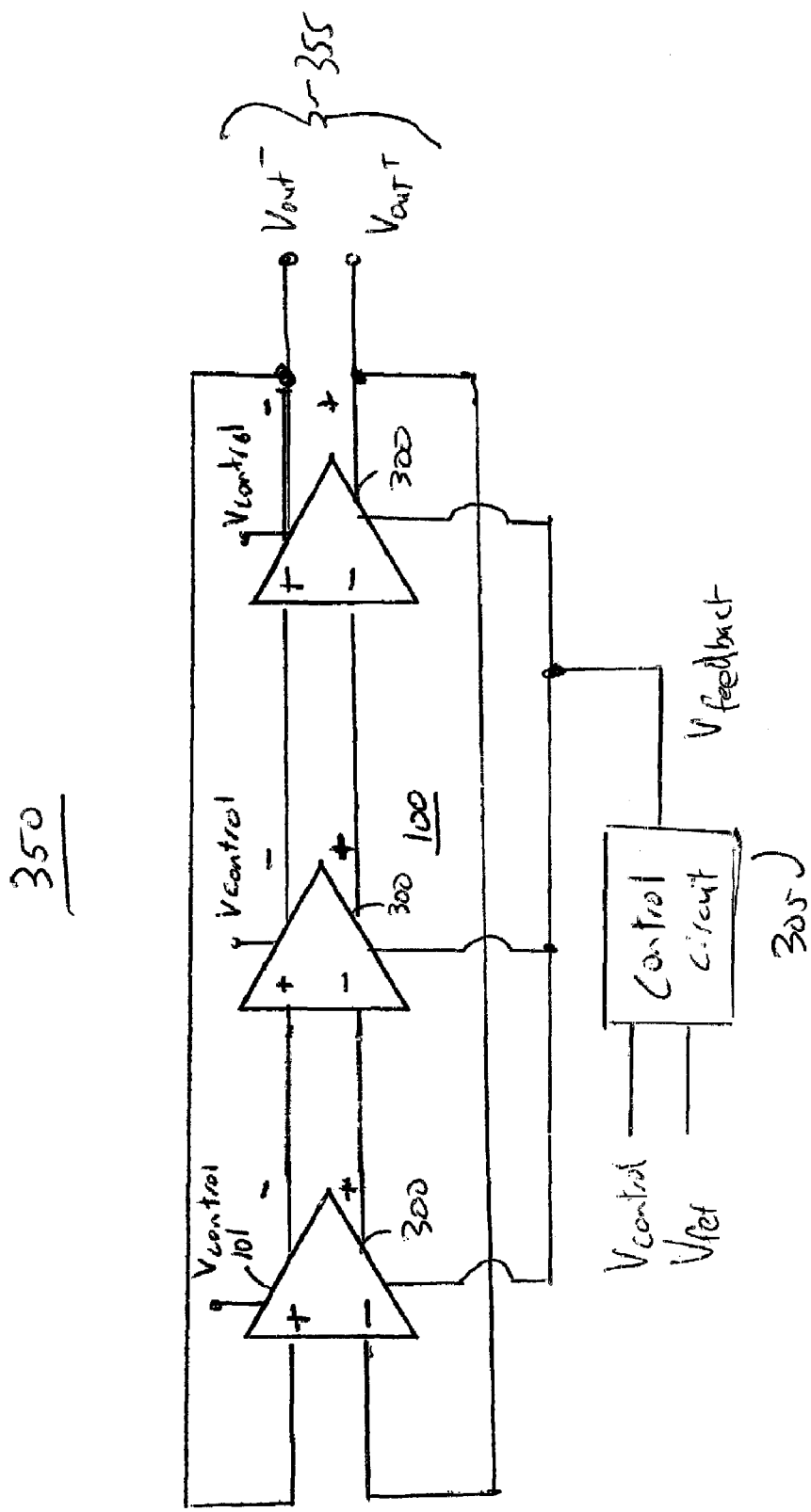

The linear dependence of the tail current I on the difference between $V_{ref}$ and $V_{cc}$ leads to the decoupling of output frequency and amplitude as follows. FIG. 3b illustrates a VCO 350 including three inverter stages 300 and control circuit 305. The output frequency ($f_{osc}$) for VCO 350 is given by $$f_{osc} = A \frac{1}{2\pi RC} \quad (4)$$

where A is a constant which depends on the number of stages; C includes all the parasitic capacitances and R is the resistance of the triode mode PFETs M2 and M3. Because these transistors are matched to M1 in control circuit 305 and have the same $V_{gs}$ as M1, their resistance R is given by $$R = \frac{V_{cc} - V_{ref}}{I} \quad (5)$$

It follows that the output frequency $f_{osc}$ may be rewritten as $$f_{osc} = A \frac{I}{2\pi(V_{cc} - V_{ref})C} \quad (6)$$

If the tail current as defined in equation (3) is substituted into equation (6), the expression for $f_{osc}$ becomes $$f_{osc} = A\mu \frac{W}{2\pi L} \frac{C_{ox}}{C}(V_{cc} - |V_{th}| - V_{cntl}) \quad (7)$$

Advantageously, the output frequency is thus entirely decoupled from the output amplitude because the output frequency has no dependence on the reference voltage $V_{ref}$. Moreover, the output frequency is a linear function of the tuning voltage $V_{cntl}$. It will be appreciated that a transistor may be inserted between M1 and N1 in the control circuit to mimic the voltage drop across the Q1 and Q2. However, because Q1 and Q2 are operating nonlinearly, being driving fully on and off, the benefit of such an extra transistor is minimal.

It is worth noting that if differential amplifier 310 drives the gate of PMOS transistor M1 (instead of the gate of N1) with a feedback voltage $V_{feedback}$, and if $V_{cntl}$ drives the gate of N1 (instead of the gate of M1), then the oscillation frequency is given by $$f_{osc} = A \frac{I}{(V_{cc} - V_{ref})C} \quad (8)$$

Where I is the tail current of N1 and N2. Note that in this case the amplitude of oscillation $f_{osc}$ depends on amplitude of oscillation $V_{cc}$–$V_{ref}$. An advantage of the present invention is that the frequency of oscillation, as given by Equation (7), is entirely decoupled from the amplitude of oscillation.

Figure 4:
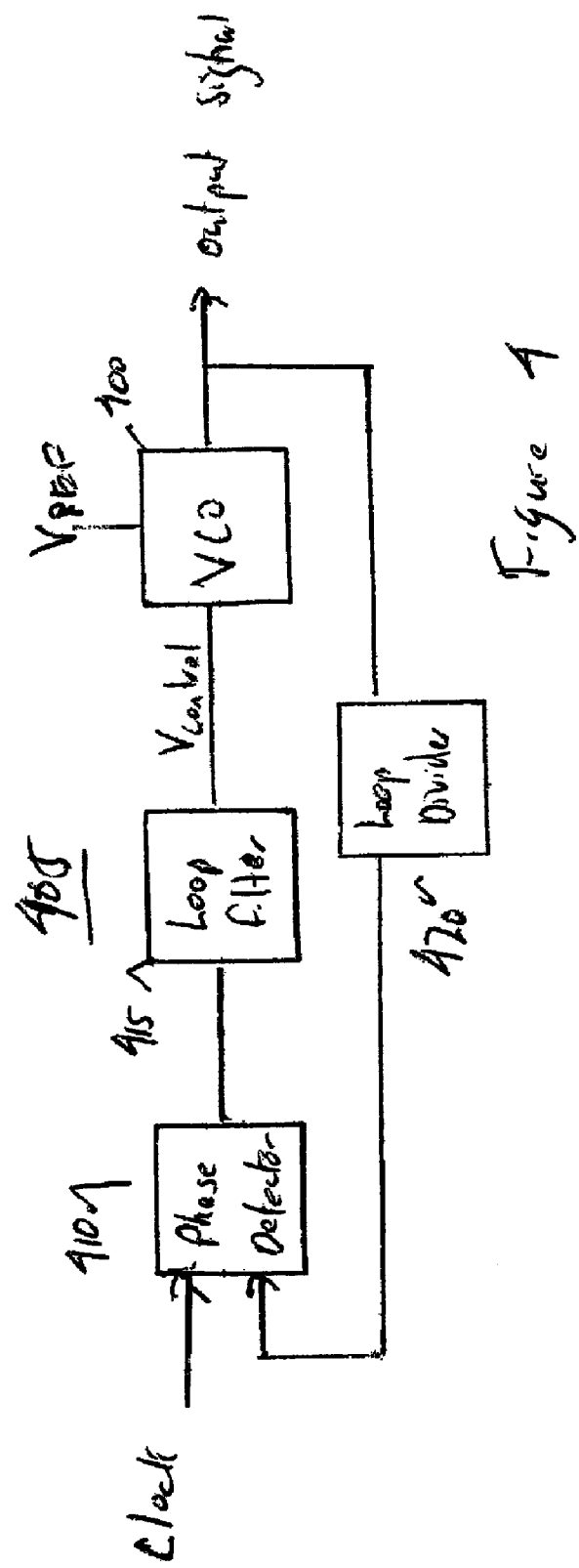
FIG. 4 is a block diagram of a phase locked loop including a VCO in accordance with an embodiment of the invention.

It will be appreciated that the number of inverter stages used to construct a VCO as discussed herein need not be three as shown in FIG. 3b. Indeed, if an inverter stage is connected in a non-inverting manner, an even number of stages may be used in the resulting VCO. Regardless of the number of stages used to construct the VCO, its frequency/amplitude independence may be used for numerous applications. For example, as shown in FIG. 4, a VCO 400 having an output signal whose frequency is tuned by the tuning voltage $V_{cntl}$ independently of its amplitude may be incorporated into a phase-locked loop (PLL) 405 that includes a phase detector 410, a loop filter 415, and a loop divider 420. VCO 400 responds to the reference voltage $V_{ref}$ as discussed above to control the amplitude of the output signal. Advantageously, this output signal amplitude will not depend on the tuning voltage $V_{cntl}$. Moreover, as the tuning voltage changes to change the output signal frequency (in response to a change in the clock signal driving the phase detector), the output signal amplitude will be unaffected.

Figure 5:
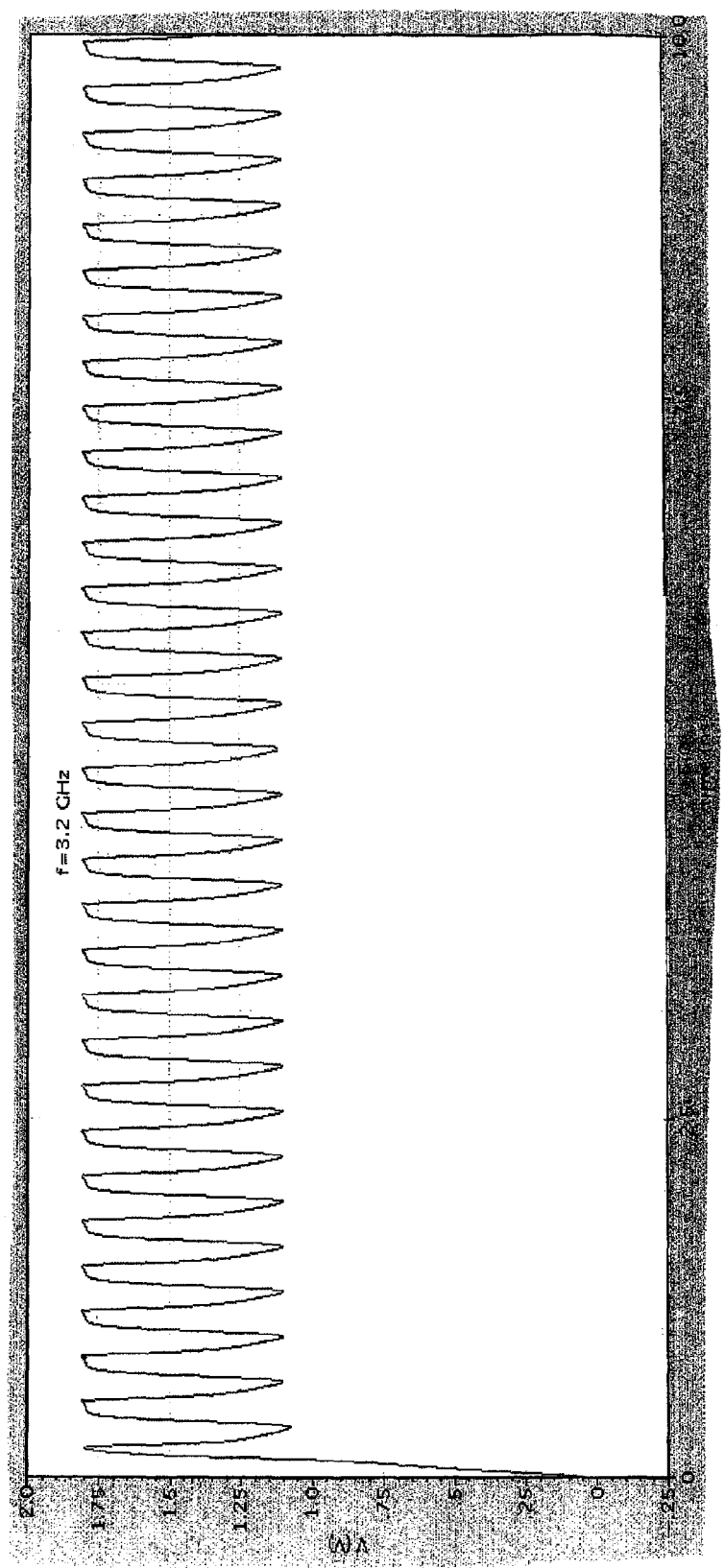
FIG. 5 is a graphical representation of 3.2 GHz output signal for the VCO of FIG. 4
Figure 6:
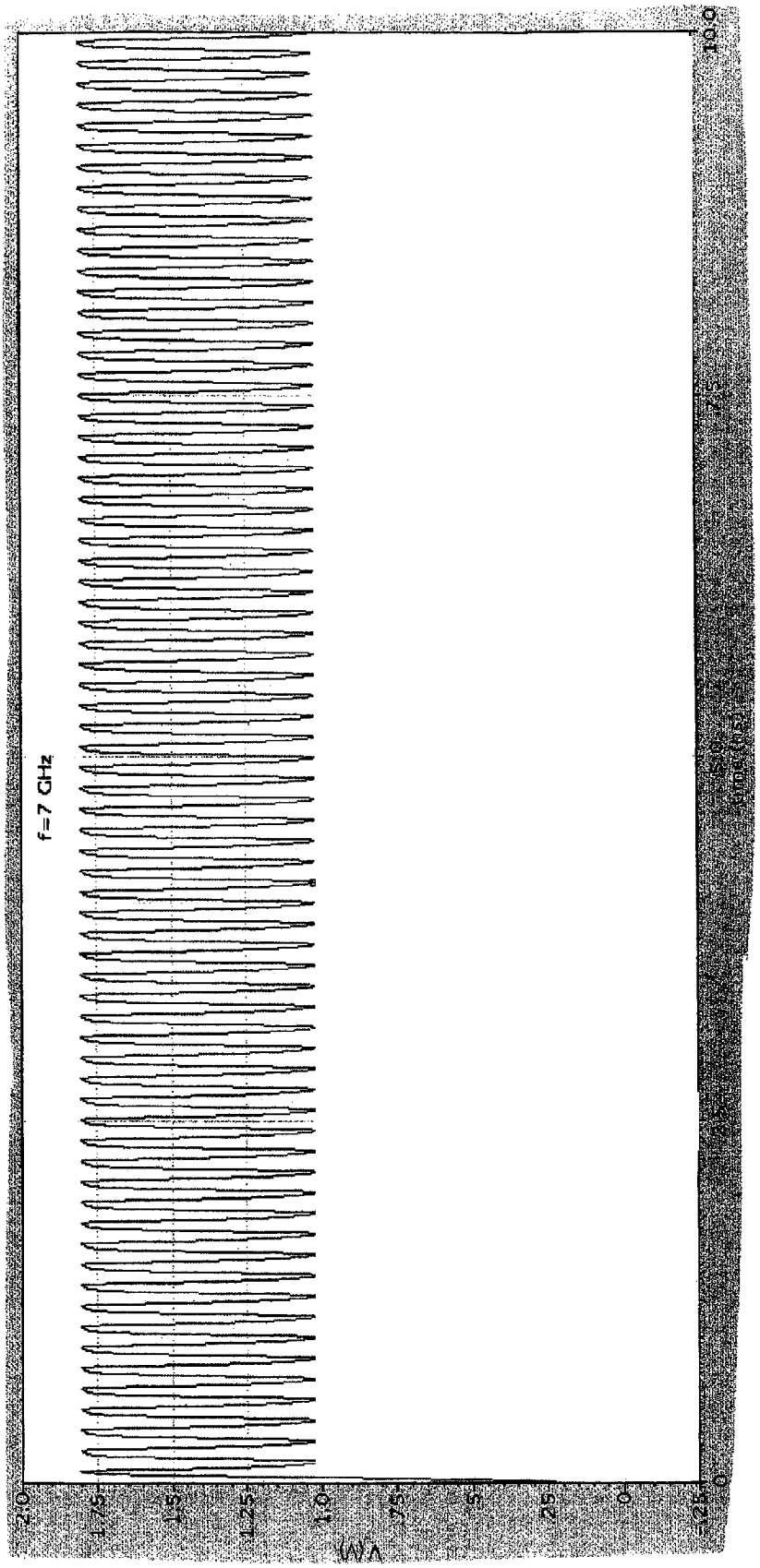
FIG. 6 is a graphical representation of a 7.0 GHz output signal for the VCO of FIG. 4.
Figure 1:
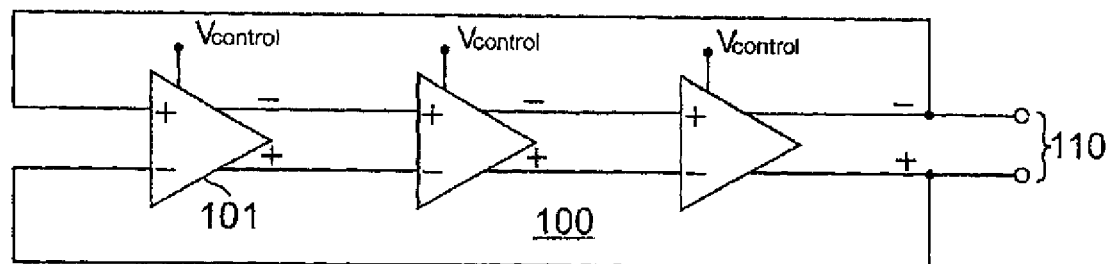
FIG. 1 is a block diagram of a conventional voltage-controlled oscillator.

The independence of the oscillation amplitude and frequency for VCO 400 is illustrated in FIGS. 5 and 6 through simulation results for 3.2 GHz operation and 7 GHz operation, respectively. As can be seen from inspection of these figures, the output amplitude changes only approximately 5% to 10% over more than a 100% tuning range.

It will be obvious to those skilled in the art that various changes and modifications may be made without departing from this invention in its broader aspects. For example, the voltage-controlled oscillator disclosed herein may be used in other applications besides phase locked loops. The appended claims encompass all such changes and modifications as fall within the true spirit and scope of this invention.

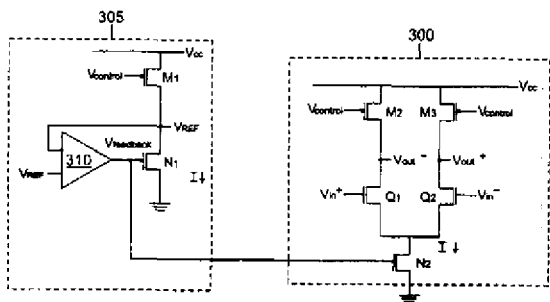

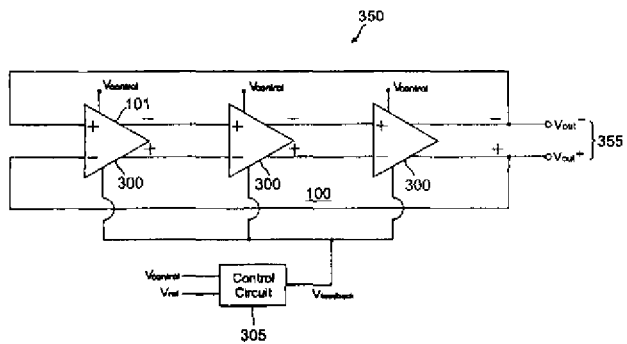

I claim:

1. A voltage-controlled oscillator having an output signal whose frequency is responsive to a tuning signal, comprising:
   a plurality of differential inverters coupled to form a loop, each differential inverter having a differential pair of transistors configured to steer a tail current from a current source transistor, each transistor in the differential pair coupling to a corresponding triode-mode transistor having a gate controlled by the tuning signal to control a frequency for the output signal, the current source transistor sourcing the tail current responsive to a feedback signal; and
   a control circuit comprising a first transistor matched to each of the triode-mode transistors and a second transistor matched to each of the current source transistors, wherein a first terminal of the first transistor couples to a node that also couples to a first terminal of the second transistor such that a voltage of the node equals a voltage of the first terminals, the first transistor having a gate driven by the tuning signal, the control circuit further comprising a differential amplifier configured to drive a gate of the second transistor with the feedback signal responsive to a difference between a reference signal voltage and the voltage of the node such that a current through the first and second transistor is a function of the difference between a supply voltage and the reference voltage and such that an amplitude of the output signal is independent of the tuning signal and depends on the reference signal.

2. The voltage-controlled oscillator of claim 1, wherein the plurality of differential inverters comprises an odd number of differential inverters.

3. The voltage-controlled oscillator of claim 1, wherein the plurality of differential inverters comprises three differential inverters.

4. The voltage-controlled oscillator of claim 1, wherein the first transistor is a PMOS transistor.

5. The voltage-controlled oscillator of claim 4, wherein the second transistor is an NNOS transistor, the node being a drain for the first and second transistors.

6. A phase locked loop (PLL), comprising:
   a phase detector operable to compare the phase between a divided signal and an input signal to provide a phase detector output;
   a loop filter to filter the phase detector output to provide a tuning signal;
   a voltage controlled oscillator (VCO) operable to provide an output signal whose frequency depends on the tuning signal, wherein the VCO is configured to respond to a reference signal to control an amplitude of the output signal, and wherein the VCO includes:
      a plurality of differential inverters coupled to form a loop, each differential inverter having a differential pair of transistors configured to steer a tail current from a current source transistor, each transistor in the differential pair coupling to a corresponding triode-mode transistor having a gate controlled by the tuning signal to control a frequency for the output signal, the current source sourcing the tail current responsive to a feedback signal; and
      a control circuit comprising a first transistor matched to each of the triode-mode transistors and a second transistor matched to each of the current source transistors, wherein a first terminal of the first transistor couples to a node that also couples to a first terminal of the second transistor such that a voltage of the node equals a voltage of the first terminals, the first transistor having a gate driven by the tuning signal, the control circuit further comprising a differential amplifier configured to drive a gate of the second transistor with the feedback signal responsive to a difference between a reference signal voltage and the voltage of the node such that a current through the first and second transistor is a function of the difference between a supply voltage and the reference signal voltage and such that an amplitude of the output signal is independent of the tuning signal and depends on the reference signal voltage.

7. The PLL of claim 6, wherein the plurality of differential inverters comprises an odd number of differential inverters.

* * * * *

UNITED STATES PATENT AND TRADEMARK OFFICE
CERTIFICATE OF CORRECTION

| | | |
|---|---|---|
| PATENT NO. | : 7,639,093 B2 | |
| APPLICATION NO. | : 11/618812 | |
| DATED | : December 29, 2009 | |
| INVENTOR(S) | : Mohammad Ardehali | |

It is certified that error appears in the above-identified patent and that said Letters Patent is hereby corrected as shown below:

The title page should be deleted and substitute therefor the attached title page.

The drawing sheets 1-6 should be deleted and substitute therefor the attached drawing sheets 1-6 consisting of Figs. 1-6 as shown on the attached pages.

Signed and Sealed this
Fifteenth Day of March, 2011

David J. Kappos
*Director of the United States Patent and Trademark Office*

(12) United States Patent
Ardehali

(10) Patent No.: US 7,639,093 B2
(45) Date of Patent: Dec. 29, 2009

(54) VOLTAGE-CONTROLLED OSCILLATOR HAVING INDEPENDENT OUTPUT FREQUENCY AND AMPLITUDE

(75) Inventor: Mohammad Ardehali, Camarillo, CA (US)

(73) Assignee: Tialinx, Inc., Newport Beach, CA (US)

( * ) Notice: Subject to any disclaimer, the term of this patent is extended or adjusted under 35 U.S.C. 154(b) by 48 days.

(21) Appl. No.: 11/618,812

(22) Filed: Dec. 30, 2006

(65) Prior Publication Data
US 2008/0157878 A1    Jul. 3, 2008

(51) Int. Cl.
*H03K 3/023*    (2006.01)
(52) U.S. Cl. .................... 331/57; 331/15; 331/182; 331/185
(58) Field of Classification Search .................. 331/15, 331/57, 109, 182, 183, 185, 186
See application file for complete search history.

(56) References Cited

U.S. PATENT DOCUMENTS

| | | | | |
|---|---|---|---|---|
| 5,563,553 A | * | 10/1996 | Jackson | 331/57 |
| 5,748,048 A | * | 5/1998 | Moyal | 331/34 |
| 6,414,556 B1 | * | 7/2002 | Mizuno | 331/57 |

* cited by examiner

*Primary Examiner*—Robert Pascal
*Assistant Examiner*—Levi Gannon
(74) *Attorney, Agent, or Firm*—Haynes and Boone, LLP

(57) ABSTRACT

In one embodiment, a voltage-controlled oscillator is provided having an output signal whose frequency is responsive to a tuning signal and is independent of amplitude of oscillation. The voltage-controlled oscillator includes: a plurality of differential inverter stages coupled to form a loop, each differential inverter stage having a differential pair of transistors configured to steer a tail current from a current source, the current source sourcing the tail current responsive to a feedback signal; and a control circuit configured to generate the feedback signal responsive to a reference signal such that an amplitude of the output signal is independent of the tuning signal and depends on the reference signal, and the frequency of oscillation is decoupled from the amplitude of oscillation.

7 Claims, 6 Drawing Sheets

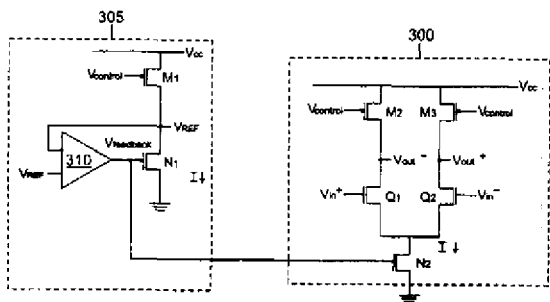

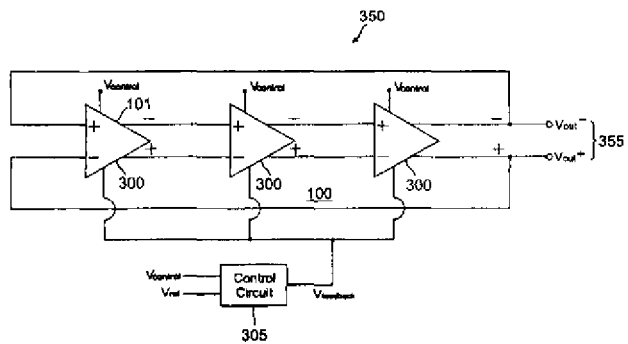

UNITED STATES PATENT AND TRADEMARK OFFICE
CERTIFICATE OF CORRECTION

| | | |
|---|---|---|
| PATENT NO. | : 7,639,093 B2 | Page 1 of 8 |
| APPLICATION NO. | : 11/618812 | |
| DATED | : December 29, 2009 | |
| INVENTOR(S) | : Mohammad Ardehali | |

It is certified that error appears in the above-identified patent and that said Letters Patent is hereby corrected as shown below:

The title page should be deleted and substitute therefor the attached title page.

The drawing sheets 1-6 should be deleted and substitute therefor the attached drawing sheets 1-6 consisting of Figs. 1-6 as shown on the attached pages.

This certificate supersedes the Certificate of Correction issued March 15, 2011.

Signed and Sealed this
Twenty-sixth Day of April, 2011

David J. Kappos
*Director of the United States Patent and Trademark Office*

(12) United States Patent
Ardehali

(10) Patent No.: US 7,639,093 B2
(45) Date of Patent: Dec. 29, 2009

(54) VOLTAGE-CONTROLLED OSCILLATOR HAVING INDEPENDENT OUTPUT FREQUENCY AND AMPLITUDE

(75) Inventor: Mohammad Ardehali, Camarillo, CA (US)

(73) Assignee: Tialinx, Inc., Newport Beach, CA (US)

( * ) Notice: Subject to any disclaimer, the term of this patent is extended or adjusted under 35 U.S.C. 154(b) by 48 days.

(21) Appl. No.: 11/618,812

(22) Filed: Dec. 30, 2006

(65) Prior Publication Data
US 2008/0157878 A1   Jul. 3, 2008

(51) Int. Cl.
*H03K 3/023* (2006.01)
(52) U.S. Cl. .......................... 331/57; 331/15; 331/182; 331/185
(58) Field of Classification Search .................. 331/15, 331/57, 109, 182, 183, 185, 186
See application file for complete search history.

(56) References Cited

U.S. PATENT DOCUMENTS

| | | | | |
|---|---|---|---|---|
| 5,563,553 A | * | 10/1996 | Jackson | 331/57 |
| 5,748,048 A | * | 5/1998 | Moyal | 331/34 |
| 6,414,556 B1 | * | 7/2002 | Mizuno | 331/57 |

* cited by examiner

*Primary Examiner*—Robert Pascal
*Assistant Examiner*—Levi Gannon
(74) *Attorney, Agent, or Firm*—Haynes and Boone, LLP

(57) ABSTRACT

In one embodiment, a voltage-controlled oscillator is provided having an output signal whose frequency is responsive to a tuning signal and is independent of amplitude of oscillation. The voltage-controlled oscillator includes: a plurality of differential inverter stages coupled to form a loop, each differential inverter stage having a differential pair of transistors configured to steer a tail current from a current source, the current source sourcing the tail current responsive to a feedback signal; and a control circuit configured to generate the feedback signal responsive to a reference signal such that an amplitude of the output signal is independent of the tuning signal and depends on the reference signal, and the frequency of oscillation is decoupled from the amplitude of oscillation.

7 Claims, 6 Drawing Sheets